(12) United States Patent
Rabenstein et al.

(10) Patent No.: US 7,573,287 B2
(45) Date of Patent: Aug. 11, 2009

(54) VARIABLE DRIVE MODULE FOR DRIVING A LOAD

(75) Inventors: Arno Rabenstein, Munich (DE); Markus Ladurner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 331 days.

(21) Appl. No.: 11/414,594

(22) Filed: Apr. 28, 2006

(65) Prior Publication Data
US 2006/0261852 A1 Nov. 23, 2006

(30) Foreign Application Priority Data
Apr. 29, 2005 (DE) .......... 10 2005 019 955

(51) Int. Cl.
*H03K 17/16* (2006.01)
(52) U.S. Cl. .............. 326/26; 326/86; 326/87; 326/113; 327/109
(58) Field of Classification Search .......... 326/82–83, 326/86–87; 327/108–109
See application file for complete search history.

(56) References Cited

U.S. PATENT DOCUMENTS

| 5,815,027 | A | 9/1998 | Tihanyi et al. | |
|---|---|---|---|---|
| 6,229,355 | B1 * | 5/2001 | Ogasawara | 327/108 |
| 6,392,859 | B1 * | 5/2002 | Ohshima | 361/100 |
| 6,661,249 | B2 * | 12/2003 | Oyrer | 324/769 |
| 6,864,641 | B2 | 3/2005 | Dygert | |
| 7,148,741 | B2 * | 12/2006 | Berger et al. | 327/538 |
| 7,304,525 | B2 * | 12/2007 | Nuebling | 327/333 |
| 2004/0217804 | A1 | 11/2004 | Moon et al. | |
| 2005/0068092 | A1 | 3/2005 | Sano | |
| 2006/0236275 | A1 * | 10/2006 | Groos | 716/4 |

FOREIGN PATENT DOCUMENTS

| DE | 19520735 A1 | 12/1996 |
|---|---|---|
| DE | 102004008896 A1 | 9/2004 |
| DE | 102004014386 A1 | 11/2004 |
| EP | 1432107 A2 | 6/2004 |
| JP | 2004288190 A2 | 10/2004 |
| JP | 2005044203 A | 2/2005 |

OTHER PUBLICATIONS

Infineon Technologies "BTS 5434G Smart High-Side Power Switch PROFET Four Channels, 60mΩ", Data Sheet, V1.0, Jan. 2004 (28 pages).
Infineon Technologies "BTS 441 T Smart Highside Power Switch One Channel: 20mΩ", Data Sheet, Oct. 1, 2003 (11 pages).

* cited by examiner

*Primary Examiner*—Vibol Tan
*Assistant Examiner*—Jason Crawford
(74) *Attorney, Agent, or Firm*—Dicke, Billig & Czaja, PLLC

(57) ABSTRACT

A drive module for driving a load is disclosed. In one embodiment, the drive module includes an output terminal for connecting the load. A first control terminal is provided for applying a first control signal, according to which the circuit arrangement provides a supply voltage having a first or a second voltage level at the output terminal. A second control terminal is provided for applying a second control signal the slope of an edge in the event of a level change in the supply voltage being dependent on the second control signal.

16 Claims, 6 Drawing Sheets

VARIABLE DRIVE MODULE FOR DRIVING A LOAD

CROSS-REFERENCE TO RELATED APPLICATIONS

This Utility Patent Application claims priority to German Patent Application No. DE 10 2005 019 955.0-32 filed on Apr. 29, 2005, which is incorporated herein by reference.

FIELD OF INVENTION

The present invention relates to a drive module for driving a load, in particular for driving a load formed as luminous means.

BACKGROUND

For driving loads, drive modules are known which are connected in series with the load between terminals for supply potentials which serve for applying a supply voltage to the load according to the control signal. In this case, so-called high-side modules are connected between a terminal for positive supply potential and the load, whilst so-called low-side modules are connected between the load and a terminal for negative supply potential or reference potential. That connection of the load which is remote from the drive module is connected to the respective further supply potential terminal.

One example of a drive module formed as a high-side module is the integrated component BTS441T from Infineon Technologies AG, Munich which is described in the data sheet BTS441T, Oct. 1, 2003. This drive module has a power transistor, the load path of which in the module is connected between a first connection for connecting the load and a second connection for applying a supply potential. During the operation of the module, the transistor is driven in the on state or in the off state by means of a driver circuit according to a drive signal present at a control input, in order to drive the load according to said drive signal. In the case of such a module, which is also referred to as a smart high side power switch, the driver circuit also comprises a protection circuit for protecting the transistor against overtemperature. Furthermore, the driver circuit may also have a measuring arrangement for measuring a current flowing to the load and an arrangement for limiting said current. In this regard, reference is made to the data sheet of the integrated component BTS5434G, V1.0, Jan. 23, 2004, Infineon Technologies AG, Munich. The current measuring arrangement may function according to the so-called current sense principle, for example, which is described in DE 195 20 735 A1.

The drive modules explained may be used in particular for driving luminous means in motor vehicles. In this case, customary luminous means are incandescent filament lamps or arrangements having one or a plurality of light emitting diodes. Light emitting diode arrangements of this type are referred to hereinafter as LEDs for short. In order not to have to provide a plurality of different modules for driving different luminous means, it is desirable to be able to use one drive module optionally for driving an incandescent filament lamp or for driving LEDs. This has been problematic hereto since a drive module optimized for driving an incandescent filament lamp does not function, or functions only inadequately, for driving a light emitting diode, as is explained below.

In order to improve the EMC compatibility, drive modules for incandescent filament lamps are dimensioned such that the rising and falling edges of a voltage present across the load which arise during the switching operations do not have an excessively steep or somewhat flattened profile. Such an edge profile may be unsuitable, however, for driving LEDs. LEDs are driven in pulse-width-modulated fashion for setting the brightness of the light that they emit. If very small duty ratios (duty cycles) are chosen for the pulse-width modulated driving, with the consequence that the pulse durations of the voltage pulses that drive the load become very short, it can happen in the case of shallow voltage edges that the voltage pulses do not reach their maximum value. A reliable diagnosis in the module, such as, for example, a reliable determination of the load current flowing is not possible in this case, however.

For these and other reasons, there is a need for the present invention.

SUMMARY

The present invention provides a drive module for driving a load. In one embodiment, the drive module includes an output terminal for connecting the load. A first control terminal is provided for applying a first control signal, according to which the circuit arrangement provides a supply voltage having a first or a second voltage level at the output terminal. A second control terminal is provided for applying a second control signal the slope of an edge in the event of a level change in the supply voltage being dependent on the second control signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

The present invention is explained in more detail below with reference to the figures.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the Figures, unless specified otherwise, identical reference symbols designate identical components and signals having the same meaning.

The present invention provides a flexible drive module for driving a load, in particular a drive module suitable both for driving an incandescent filament lamp and for driving an LED.

In one embodiment, the drive module for driving includes an output terminal for connecting the load and a first control terminal for applying a first control signal, according to which the circuit arrangement provides a supply voltage having a first or a second voltage level at the output terminal. The drive module additionally includes a second control terminal for applying a second control signal, the drive module being designed to set the slope of a rising and/or falling edge in the event of a level change in the supply voltage in a manner dependent on the second control signal.

By applying a suitable signal to the second control terminal, the drive module according to the invention can be set flexibly to a load that is respectively to be connected.

The drive module has a current measuring arrangement, which is configured to provide a measurement current whose value is at least approximately proportional to a load current flowing to the output terminal, the proportionality factor between the load current and the measurement current is in this case dependent on the second control signal. Such a current measuring arrangement having a proportionality factor dependent on the second control signal is advantageous in particular if the drive module is intended to be used optionally for driving incandescent filaments lamps, which are referred to hereinafter as incandescent lamps or light emitting diodes. This is explained in detail below.

With the same voltage present, the current consumption of an incandescent lamp is significantly higher than that of an LED arrangement driven by the drive module. It should be noted in this context that usually a plurality of LEDs connected in series are driven by such a drive module. It shall firstly be assumed, then, that the proportionality factor between load current and measurement current is invariable. With an incandescent lamp connected, the measurement current may assume values between a first minimum value, usually zero, and first maximum value which are proportional to a minimum and maximum current flowing through the incandescent lamp. The range within which the measurement current lies with an LED connected is significantly smaller owing to the smaller current through the LED, with the consequence that measurement inaccuracies in the determination of a current flowing through the LED have a significantly greater effect. This disadvantage is avoided if the proportionality factor between the load current and the measurement current is set to a smaller value with an LED connected than with an incandescent lamp connected. The ratio of the different proportionality factors advantageously corresponds to the ratio of the maximum currents flowing in the case of the different loads. The measurement current with an incandescent lamp connected and a maximum incandescent lamp current then corresponds to the measurement current with an LED connected and a maximum current flowing.

In one embodiment, the drive module has a first MOS transistor having a control terminal and a load path connected between a terminal for a supply potential at the output terminal, and a second MOS transistor having a control terminal and a load path connected between the terminal for the supply potential and the output terminal. The drive module additionally comprises a driver circuit, to which the first control signal is fed and which has an output connected to the control terminal of the first MOS transistor. A switching element driven by the second control signal is additionally present, said switching element being connected between the output of the second driver circuit and the control terminal of the second MOS transistor.

In this case, the drive circuit may be a conventional drive circuit which is designed to provide a charging current or a discharging current according to the first control signal. Charging current and discharging current are referred to jointly as control current hereinafter.

An operating state of the drive module in which the switching element connected upstream of the control terminal of the second MOS transistor is open is referred to hereinafter as first operating state. An operating state in which said switching element is closed is referred to hereinafter as second operating state of the drive module.

During the first operating state, the control current supplied by the drive circuit flows exclusively to the first MOS transistor, while the control current is divided between the first and second MOS transistors in the second operating state. In the first operating state, the first MOS transistor serves exclusively for driving the load, while in the second operating state the first MOS transistor and the second MOS transistor serve for driving the load. In the first operating state, in which the control current flows exclusively to the first MOS transistor, said first MOS transistor undergoes a transition from the blocking operating state to the conducting operating state or from the conducting operating state to the blocking operating state more rapidly than is the case for the first and second MOS transistors in the second operating state, in which the control current is divided between the two transistors. The consequence of this is that rising and falling edges of a supply voltage present across the load during the first operating state are greater than rising and falling edges of the supply voltage present across the load in the second operating state.

In a further embodiment of the drive module, a transistor is present, the load path of which is connected between the output terminal of the drive module and a terminal for applying a supply potential. A drive circuit having a first and a second drive stage is present for driving this MOS transistor. Depending on the second control signal, in this case only one of these two drive stages or both drive stages is or are connected to the drive connection of the MOS transistor. The time duration required by the MOS transistor in order to undergo transition from the blocking state to the conducting state or from the conducting state to the blocking state is greater when there is only one drive stage connected than when there are two drive stages connected. The consequence of this is that the slope or rising and falling edges of a supply voltage present across the load is smaller if the MOS transistor is driven only by one drive stage.

Figure 1:
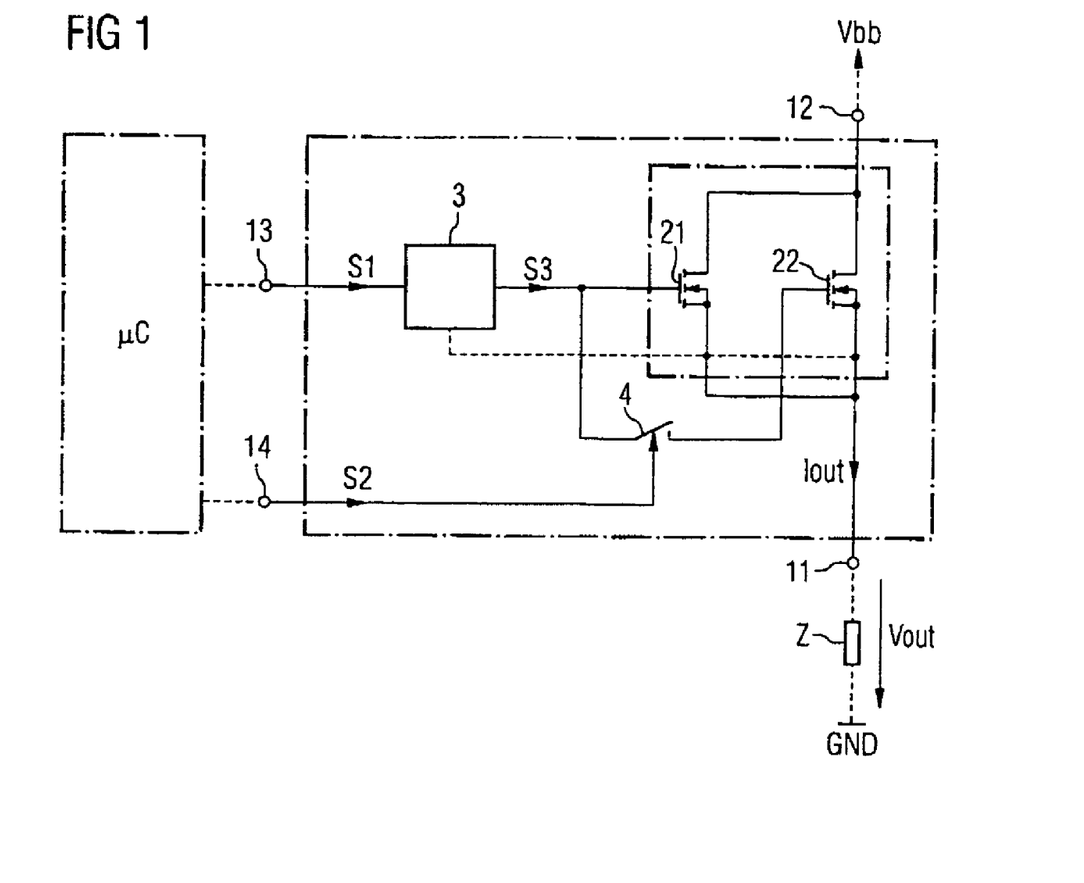
FIG. 1 illustrates a drive module according to the invention with two MOS transistors which can be connected in parallel according to a control signal for driving a load.

FIG. 1 illustrates a first exemplary embodiment of a drive module according to the invention for driving a load Z. The drive module has first and second output terminals 11, 12, which serve for being connected in series with the load Z between supply potential terminals. In order to afford a better understanding, FIG. 1 also illustrates a possible interconnection of this drive module. In the example, the drive module serves as a so-called high-side drive module and is connected between a terminal for supply potential Vbb and the load Z. A connection of the load that is remote from the drive module is connected to a terminal for negative supply potential or reference-ground potential GND. In this case, the first output terminal 11 of the drive module serves as load connection 11, while the second output connection 12 serves as supply potential connection.

The drive module has two MOS transistors 21, 22, the load paths of which, that is to say the drain-source paths of which, are connected in parallel between the output terminals 11, 12 of the drive module. In the example, the two MOS transistors 21, 22 are formed as n-channel transistors whose source connections are connected to the first output connection 11 and whose drain connections are connected to the second output connection 12.

For driving the two MOS transistors 21, 22, a drive circuit 3 is present which provides the drive signal S3 for the two MOS transistors 21, 22 according to a first control signal S1 present at a first control terminal 13. Said drive circuit 3 may be a conventional driver circuit for a MOS transistor used as a high-side switch, which circuit is designed to supply a charging current or a discharging current to the gate connections of the two transistors 21, 22 depending on the level of the first control signal S1 as drive signal S3.

The gate connection of a first transistor 21 of the two MOS transistors 21, 22 is directly connected to an output of the drive circuit 3, while the gate connection of the second transistor 22 of the two MOS transistors 21, 22 is connected to the output of the drive circuit 3 via a switching element 4. Said switching element 4 is driven according to a second control signal S2, which can be fed to the drive module at a second control input 14.

The first and second control signal S1, S2 are generated for example by a micro controller µC; this micro controller µC is illustrated in FIG. 1 merely in order to afford a better understanding of the functioning of the drive module. Said micro controller µC is designed for example to supply a pulse-width-modulated signal to the drive module as first control signal S1. The drive circuit 3 converts this pulse-width-modulated signal S1 into suitable drive signals S3 for the two MOS transistors in order that, when the switching element 4 is open, the first MOS transistor 21 or, when the switching element 4 is closed, both MOS transistors 21, 22 is or are driven in the on-state or in the off-state with the timing of this pulse-width-modulated control signal. When the transistor 21 or the transistors 21, 22 is or are driven in the on state, there is present at the load Z a supply voltage Vout which, disregarding the on resistance of the MOS transistors 21, 22, corresponds approximately to the supply voltage Vbb.

Figure 2:
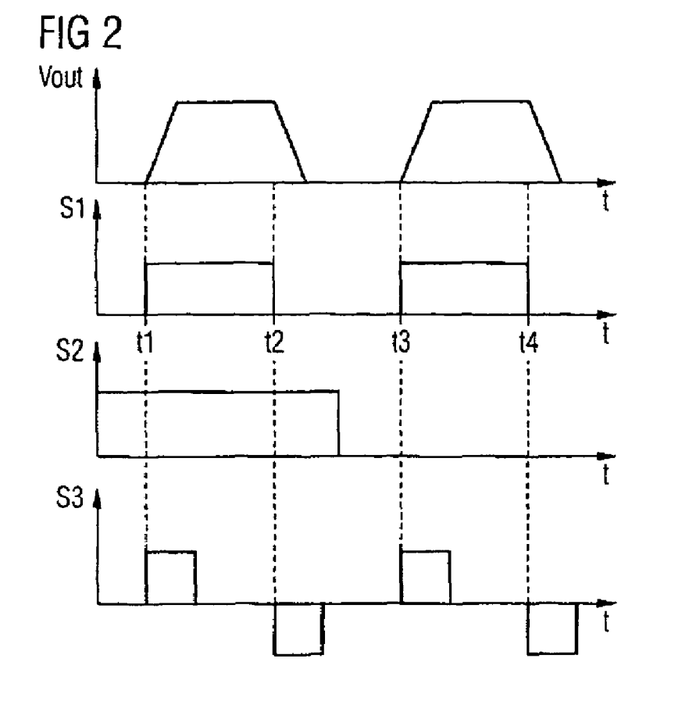
FIG. 2 illustrates by way of example temporal profiles of selected signals occurring in the circuit in accordance with FIG. 1 for a first and a second operating state of the drive module.

The functioning of the drive module illustrated in FIG. 1 is illustrated below on the basis of temporal profiles in FIG. 2. In this case, FIG. 2 illustrates the temporal profile of the output voltage Vout present across the load Z depending on the first and second control signals S1, S2. The illustration shows the temporal profile of the output voltage Vout for two operating states of the drive module, namely a first operating state, in which the switching element 4 is closed, so that both MOS transistors 21, 22 are driven by the drive circuit 3, and also a second operating state, in which only the first MOS transistor 21 is driven.

It shall be assumed for explanation purposes that the switching element 4 conducts when the second control signal S2 assumes a high level. The first operating state of the drive module is then present when the second control signal S2 is at a high level, while the second operating state is present when said second control signal S2 is at a low level.

For the further explanation, it shall additionally be assumed that the first MOS transistor 21 or both MOS transistors 21, 22 are intended to be driven in the on state, that is to say are intended to be switched on, when the first control signal S1 is at a high level, while the MOS transistor 21 or the MOS transistors 21, 22 are intended to be driven in the off-state, that is to say are intended to be switched off, when the first control signal S1 is at a low level. FIG. 2 illustrates two "switch-on periods" of the first control signal S1 and the temporal profile of the resultant output voltage Vout for the two different operating states of the drive module.

A first switch-on duration of the first control signal S1 begins at a first instant t1 and ends at a second instant t2. Both instants lie within a duration of the first operating state during which the switching element 4 is thus closed. Beginning at the first instant t1, the two MOS transistors 21, 22 are driven by the drive circuit 3, by the drive circuit 3 providing a gate charging current as drive signal S3. The drive circuit 3 may be designed to provide an approximately constant charging current for on-state driving of the MOS transistors 21, 22 until a gate-source voltage of the MOS transistors reaches a predetermined value at which the two transistors reliably turn on. The drive circuit 3 may furthermore also be designed in such a way that it generates a temporally varying load current in order for example to ensure an EMC-optimized driving of the two MOS transistors. The drive circuit correspondingly generates a discharging current for off-state driving of the two transistors 21, 22. Said discharging current may be a constant discharging current or a temporally varying discharging current.

The drive signal S3 generated by the drive circuit 3, that is to say the charging current generated by the drive circuit 3 or the discharging current generated by the drive circuit 3, is independent of whether only the first transistor 21 or whether both transistors 21, 22 is or are intended to be driven. Taking account of the fact that for on-state or off-state driving of a MOS transistor, the gate capacitance of the latter has to be subjected to charge reversal, the generation of the drive signal S3 independently of the number of transistors 21, 22 driven has the consequence that the temporal profile of the output voltage Vout is dependent on the second control signal S2. If, with the switching element 4 closed, both transistors are driven in the on state by the drive circuit 3, as is illustrated in FIG. 2 starting from the instant T1, then the switch-on operation is prolonged in comparison with the second operating state, in which only the first MOS transistor 21 is driven. A consequence of this is that a rising edge of the supply voltage Vout present across the load Z is shallower during the first operating state than during the second operating state. It should be noted in this context that these edges are illustrated as linearly rising edges in FIG. 2 for the sake of simplicity, but this represents only an approximation to the real voltage profile. The duration of the discharging operation is correspondingly longer during the first operating state, in which both switches 21, 22 are driven via the drive circuit 3, than during the second operating state. FIG. 2 illustrates such a discharging operation during the first operating state beginning with the instant t2, and for the second operating state such a discharging operation is illustrated in FIG. 2 beginning with the instant t4.

To summarize, in the case of the drive module in accordance with FIG. 2, different temporal profiles for the rising and falling edges of the output voltage Vout can be set depending on the second control signal S2. The drive module is suitable in particular for optionally driving one or a plurality of incandescent filament lamps or one of a plurality of LEDs as load. For driving an incandescent filament lamp as load Z, the drive module is operated in the first operating state in which both MOS transistors 21, 22 are driven, with the consequence that rising and falling edges of the supply voltage Vout present across the load Z are flattened, which is advantageous for reducing the EMC emission.

For driving one or a plurality of light emitting diodes, the drive module is operated in the second operating state, in which only the first MOS transistor 21 serves for driving the load. Rising and falling edges of the supply voltage Vout are steeper in this case than during the first operating state, as a result of which, in particular, a pulse-width-modulated driving of the load is possible even in the case of small duty ratios (Duty Cycles), that is to say in the case of short drive pulses.

The first and second transistors 21, 22 are preferably integrated in a common semiconductor chip, which is illustrated by the broken lines surrounding the two transistors in FIG. 1. The transistors comprise for example a cell structure with a multiplicity of identically constructed transistor cells, said cell structure being known in the case of power transistors. In this case, each of said transistors cells fulfils the function of a transistor. The two transistors 21, 22 can be realized such that the source connections of all the transistor cells are connected to a common connection, and that the drain connections of all the transistor cells are connected to a common connection. The gate connections of one portion of said transistor cells are connected to a common connection and form the gate connection of the first transistor, while the gate connections of the other portion of the transistor cells are connected to a second connection which forms the gate connection of the second transistor 22.

The ratio of the active transistor areas of the two transistors 21, 22 can be set depending on the desired purpose of use. For optionally driving an incandescent filament lamp or an LED, the ratio between an active transistor area N21 of the first transistor 21 and an active transistor area N22 of the second transistor 22 is for example 1:2, so that N21:N22=1:2 holds true. In the case of cellularly constructed transistors, the ratio of the transistor areas is equal to the ratio of the number of transistor cells of one transistor to the number of transistor cells of the other transistor, provided that the transistor cells are in each case dimensioned identically.

In the case where a ratio of the active transistor areas is 1:2, by way of example, the edge slope increases by the factor 3 when changing over from the first operating state to the second operating state. If the slope of the switching edges of the output voltage is between 0.1 V/µs and 0.5V/µs during the first operating state, then said edge slope is higher by the factor 3, with a value of 0.3V/µs to 1.5V/µs, during the second operating state.

The switch-on only of the first transistor 21 during the first operating state has the effect that the on resistance of the first operating state is higher than during the second operating state. Given the ratio of the transistor areas of 1:2 explained, the on-resistance during the first operating state is higher by the factor 3 than the on-resistance during the second operating state. This is noncritical when loads which, such as LEDs for example, have a low current consumption are driven during the second operating state.

Figure 3:
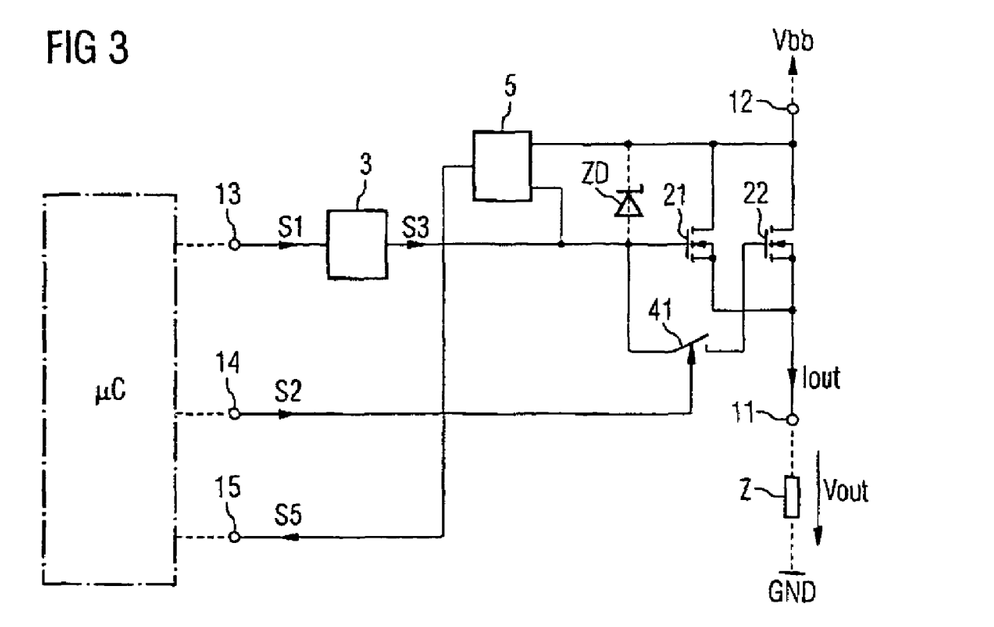
FIG. 3 illustrates a drive module in accordance with FIG. 1 which additionally has a current measuring arrangement for detecting a load current flowing to an output terminal of the drive module.

FIG. 3 illustrates a modification of the drive module illustrated in FIG. 1, said drive module additionally having a current measuring arrangement 5. Said current measuring arrangement provides a current measurement signal S5 at a first measurement output 15 of the drive module, said current measurement signal being at least approximately proportional to an output current Iout flowing to the load connection terminal 11 during operation. Further processing of said current measurement signaling S5 may be effected for example in a micro controller µC.

Figure 4:
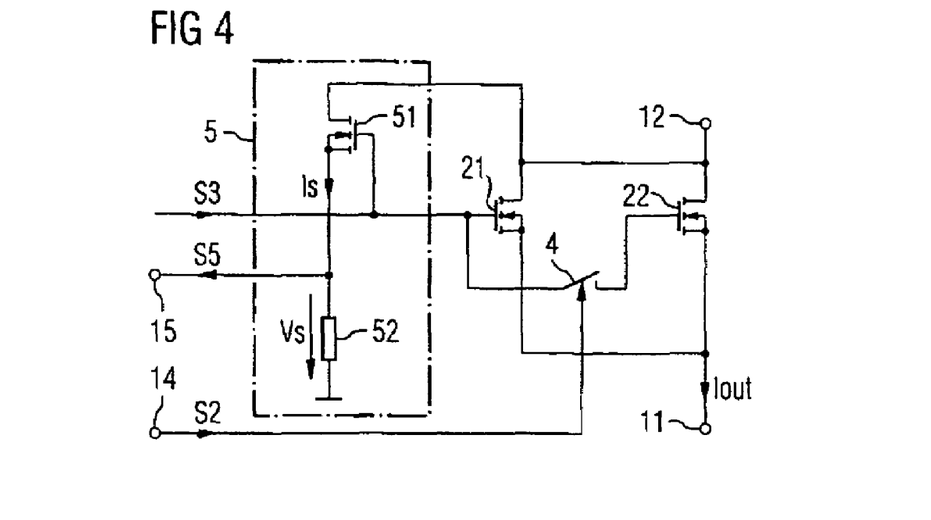
FIG. 4 illustrates an exemplary circuitry realization of the current measuring arrangement in accordance with the first embodiment.

A first exemplary circuitry realization of such a current measuring arrangement 5 is illustrated in FIG. 4.

This current measuring arrangement functions according to the so-called current sense principle and comprises a measuring transistor 51, which is of the same conduction type as the first and second MOS transistors 21 and 22. The gate connection of said measuring transistor 51 is connected to the gate connection of the first MOS transistor 21 and, when the switching element 4 is conducting also to the gate connection of the second MOS transistor 22. The drain connection of said measuring transistor 51 is connected to the drain connections of the first and second transistors 21 and 22 and thus to the supply potential connection 12. A measuring resistor 52 is connected to the source connection of the measuring transistor 51 and its connection remote from the source connection is connected to a reference potential, for example reference-ground potential GND. With on-state driving of the first transistor 21 or of the first and second transistors 21, 22, by means of the drive signal S3, the measuring transistor 51 is likewise driven in the on state and has a measurement current Is flowing through it in this case. Said measure current Is brings about a measurement voltage Vs across the measuring resistor 52, said measurement voltage being supplied to the first measurement output 15 as current measurement signal S5. The measurement current Is is approximately proportional to the output current Iout by way of the ratio of the transistor area of the measuring transistor 51 to the transistor areas of the first and second transistor 21, 22. This proportionality factor between the output current Iout and the measurement current Is is different for the two operating states of the drive module, as will additionally be explained in connection with FIG. 5.

The measurement current Is in the case of the measuring arrangement in accordance with FIG. 4 is only approximately proportional to the output current Iout since it is not exactly ensured that the measuring transistor 51 is operated at the same operating point as the two load transistors 21, 22.

Figure 5:
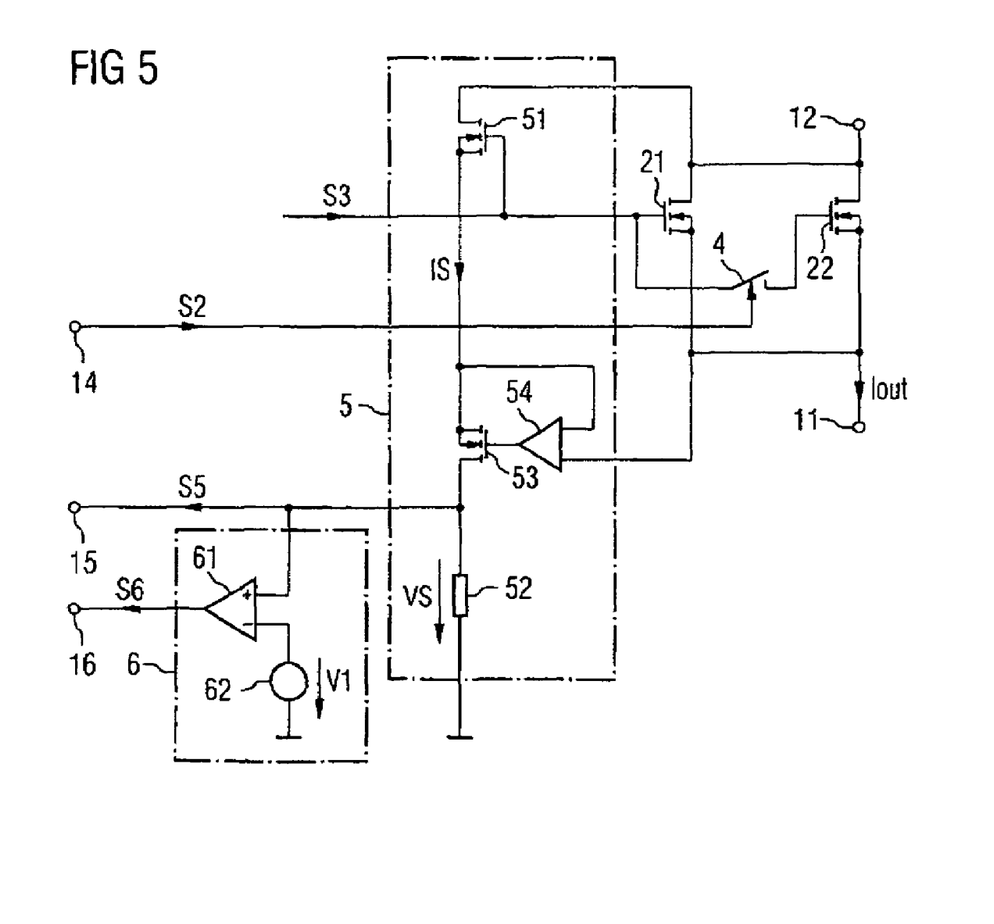
FIG. 5 illustrates a further exemplary circuitry realization of the current measuring arrangement.

An exemplary circuitry realization of an improved current measuring arrangement 5 is illustrated in FIG. 5. In the case of this current measuring arrangement, a further transistor 53 is connected in series with the load path of the measuring transistor 51, said further transistor fulfilling the function of a regulator. This measuring transistor 53 is driven by means of an operational amplifier 54. The operational amplifier 54 compares the common source potential of the load transistors 21, 22 with the source potential of the measuring transistor 51 and drives the regulating transistor 53 in such a way that the source potential of the measuring transistor corresponds to the source potential of the load transistors 21, 22. The measuring transistor 51 and the first transistor 21 or the measuring transistor 51 and the first and second load transistors 21, 22 are then operated at the same operating point, so that the measurement current Is is proportional to the output current Iout. Hereinafter, $k_{ILIS}$ designates the proportionality factor between the load current Iout and the measurement current Is:

$$k_{ILIS} = Iout/Is \quad (1).$$

The proportionality factor between the measurement current Is and the load current Iout is correspondingly designated by $1/k_{ILIS}$.

This proportionality factor is different for the two operating states of the drive module. The active transistor area of said measuring transistor or the number of transistor cells of said measuring transistor 51 shall be designated hereinafter by N51. The following then holds true for the proportionality factor $k_{ILIS}$ during the first operating state:

$$k_{ILIS} = (N21+N22)/N51 \quad (2a).$$

The following holds true during the second operating state:

$$k_{ILIS} = N21/N51 \quad (2b).$$

A customary value for this proportionality factor during the second operating state is $k_{ILIS}=1000$. Given the area ratio of the two load transistors of 1:2, $k_{ILIS}=3000$ then holds true for the proportionality factor during the first operating state.

In other words: in the first operating state, the measurement current Is is smaller than the load current by the factor 3000, while the measurement current Is in the second operating state is smaller than the load current Iout only by the factor 1000. This is advantageous if, during the second operating state, loads, for example LEDs are driven which have a lower current consumption than loads which are driven during the first operating state, such as incandescent filament lamps. The reduction of the $k_{ILIS}$ factor in the transition from the first to the second operating state also makes it possible to accurately detect the smaller currents flowing during the second operating state.

The drive module in accordance with FIG. 5 has, in addition to the first measurement output 15, a second measurement output 16, at which an overcurrent signal S6 is available. Said overcurrent signal S6 is generated by an overcurrent detector 6 from the measurement current Is or from the measurement voltage present across the measuring resistor 52. The overcurrent detector as a comparator 61, which compares the measurement voltage Vs with a reference voltage V1 generated by a reference voltage source 62. In the example, the overcurrent signal S6 assumes a high level if the measurement voltage Vs exceeds the value of the reference voltage V1. The reference voltage V1 is set to the measuring resistor 52 and the proportionality factor $k_{ILIS}$ between load current Iout and measurement current Is such that the overcurrent signal S6 assumes a high level when the load current Iout exceeds a predetermined threshold value. Owing to the different proportionality factor for the two operating states, said current threshold at which the overcurrent signal S6 assumes the high level is also different for the two operating states. If the proportionality factors for the first and second operating states differ by a factor n, then the overcurrent thresholds for these two operating states correspondingly differ by said factor n.

In the example in accordance with FIG. 5, the current measuring arrangement 5 and the overcurrent detector 6 jointly utilize a current measuring transistor. It should be pointed out in this connection that it is also possible, of course, to provide separate measuring transistors for the current measuring arrangement and the overcurrent detector.

Figure 6:
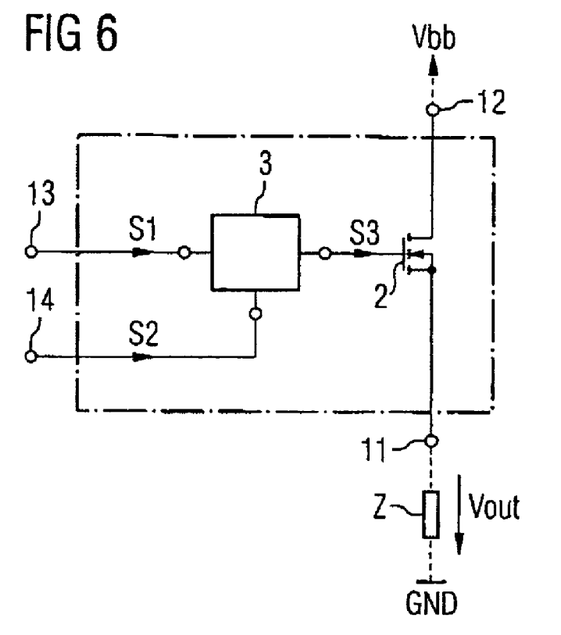
FIG. 6 illustrates a further exemplary embodiment of a drive module having a MOS transistor driving the load and a drive circuit for driving the MOS transistor.

FIG. 6 illustrate a second exemplary embodiment of the drive module according to the invention. This drive module comprises only one transistor 2 as load transistor, said transistor 2 being formed as an n-channel MOSFET in the example and its drain-source path being connected between the two output terminals 11, 12. Said transistor 2 is driven by means of a drive circuit 3 according to a first control signal S1 present at the first control input 13, said drive circuit generating a drive signal S3 depending on the first control signal. In the case of this drive module, the drive circuit 3 is also fed, in addition to the first control signal S1, the second control signal S2 present at the second control input 14 for generating the drive signal S3 for the MOS transistor 2. This drive circuit 3 is designed to generate charging and discharging currents for the gate capacitance of the MOS transistor 2 with a different characteristic depending on the second control signal S2, in order to achieve shallower switching edges of a supply voltage Vout present across the load Z during a first operating state than during a second operating state.

Figure 7:
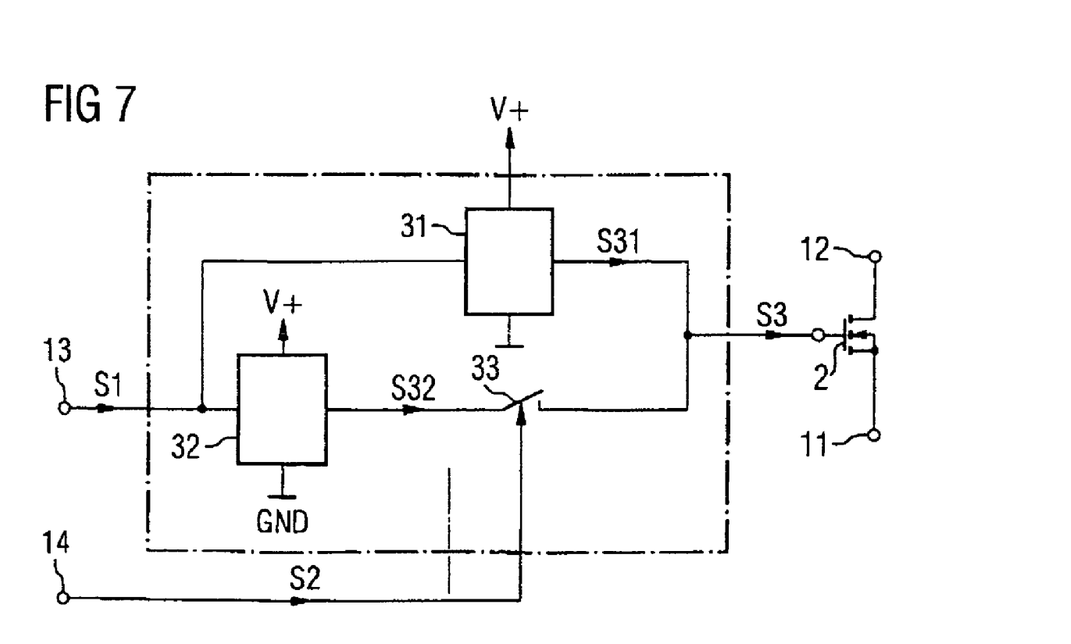
FIG. 7 illustrates a drive circuit for drive modules in accordance with FIG. 6 with two drive stages.

FIG. 7 illustrates an exemplary realization of such a drive circuit. In this case, the drive circuit comprises two drive units 31, 32. Each of these drive units 31, 32 may be realized by a conventional drive circuit for driving a MOS transistor used as a high-side switch. Such drive circuits generate charging and discharging currents for the gate capacitance of the driven MOS transistor according to a control signal, in the example according to the first control signal S1, in a sufficiently known manner. In this case, the charging current for on-state driving or the discharging current for off-state driving may be constant over time or may vary over time in order to achieve driving that is optimized with regard to EMC emissions.

The two drive units 31, 32 are in each case driven separately by the first control signal S1, S2. Each of the drive units 31, 32 provides a drive signal S31, S32 at an output according to the first control signal S1. In this case, the first drive signal S31 of the first drive unit 31 is fed directly to the gate connection of the MOS transistor 2. By contrast, a switch 33 is connected between the output of the second drive unit 32 and the gate connection of the MOS transistor 2, said switch being driven by the second control signal S2. During a first operating state, the switch 33 is opened, so that the MOS transistor 2 is only driven by the first drive signal S31. During a second operating state, the switch 33 is closed, so that the drive signals S31, S32 jointly drive the MOS transistor 2 with the consequence that switching edges of the output voltage Vout are steeper during said second operating state than during the first operating state. The drive signals supplied to the two drive units may in each case be identical, but may differ by a predetermined factor. Thus, one embodiment provides for the charging and discharging current supplied by the first drive unit 31 to be a factor of 2 smaller than the charging and discharging current supplied by the second drive unit 32. The charging and discharging currents supplied to the MOS transistor 2 during the first and second operating states then differ by the factor 3 in each case.

Figure 9:
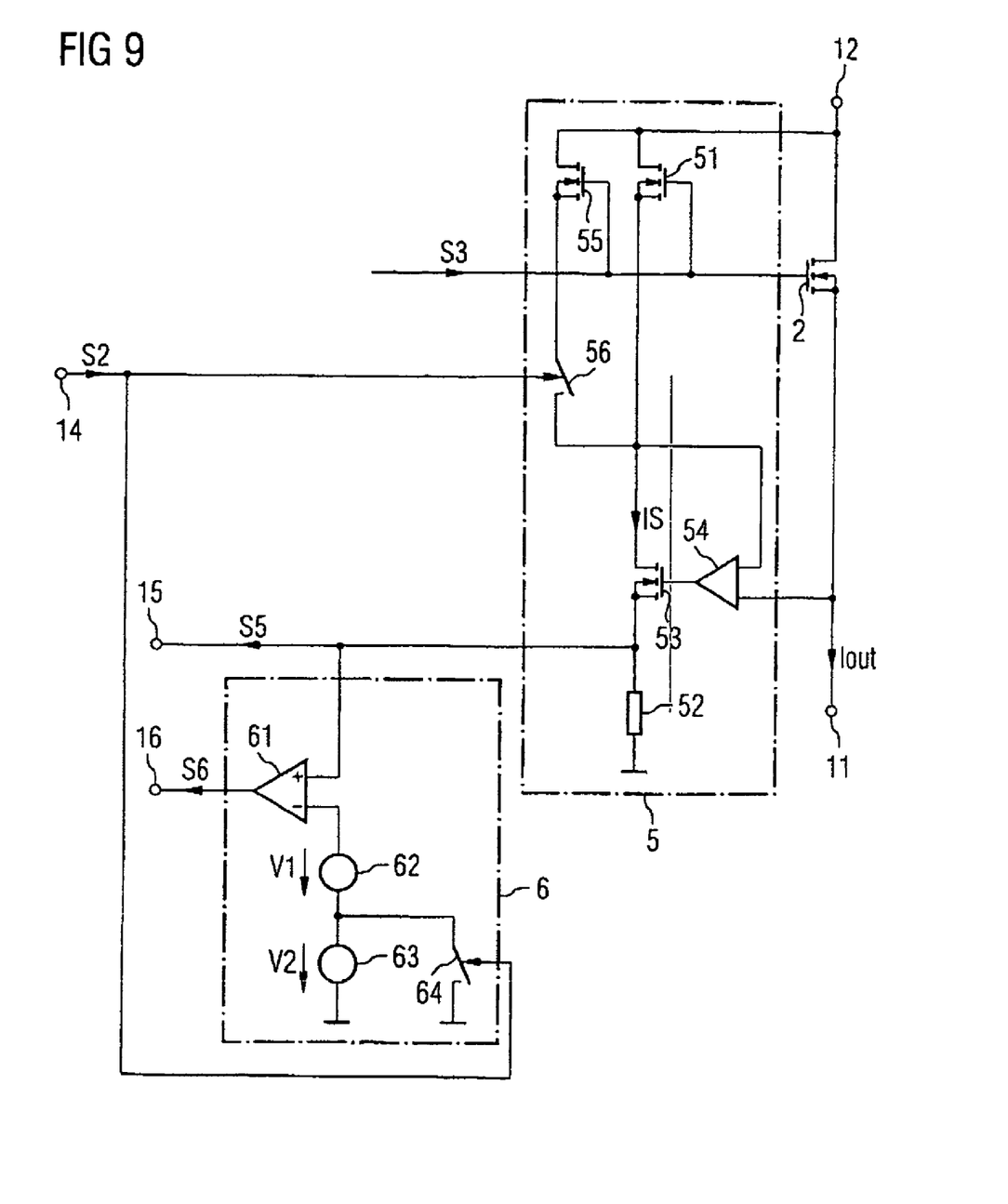
FIG. 9 illustrates an exemplary circuitry realization of a current measuring arrangement for the drive module in accordance with FIG. 6.

FIG. 9 illustrates a current measuring arrangement 5 and an overcurrent detector 6 for such a drive module. The current measuring arrangement 5 differs from that explained with reference to FIG. 5 by virtue of the fact that two measuring transistors, a first measuring transistor 51 and a second measuring transistor 55, are present, the second measuring transistor 55 of which contributes to the current measurement depending on the second control signal S2. For this purpose, a switch 56 is connected in series with the load path of said second measuring transistor 55, which is driven depending on the second control signal S2. During the first operating state, the switch 56 is open and the measurement current Is is then only generated by the first measuring transistor 51. During the second operating state, staid switch 56 is closed, as a result of which the measurement current Is is then generated by both measuring transistors 51, 55. For a given output current Iout, the measurement current Is is then higher during the second operating state than during the first operating state. The following holds true for the proportionality factor of the first operating state:

$$k_{ILIS}=N2/N51 \quad (3a),$$

where N2 designates the transistor area of the MOS transistor 2 or the number of transistor cells of said transistor, and N51 designates the transistor area of the first measuring transistor 51 or the number of transistor cells of said measuring transistor 51.

The following holds true for the proportionality factor during operation of the drive module in the second operating state:

$$k_{ILIS}=N2/(N51+N55) \quad (3b),$$

where N55 designates the active transistor area or the number of cells of the second measuring transistor 56.

FIG. 9 additionally illustrates an overcurrent detector for the drive module in accordance with FIG. 6. Said overcurrent detector differs from that illustrated in FIG. 5 by virtue of the fact that two reference voltage sources, namely a first reference voltage source 62 and second reference voltage source 63, are present, the second reference voltage source 63 of which can be bridged by means of a switch 64. Said switch is driven by the second control signal S2 in order to supply a different reference voltage to the comparator 61 during the second operating state than during the first operating state.

Figure 8:
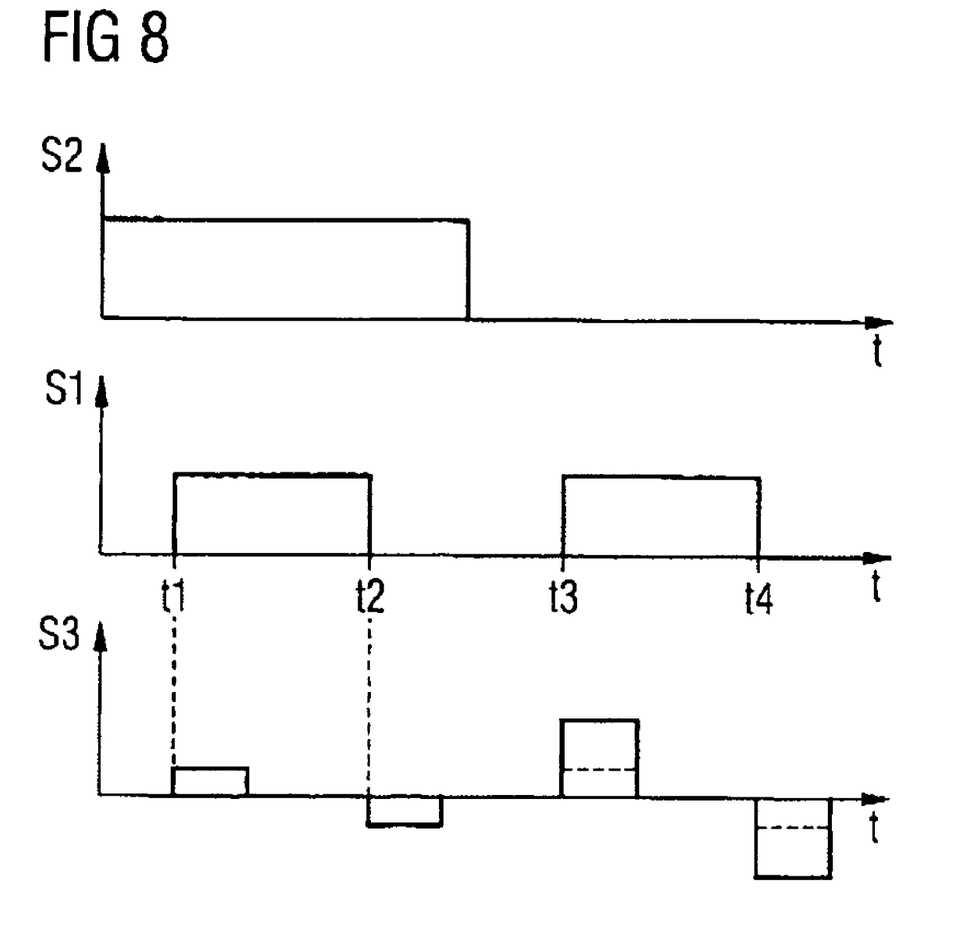
FIG. 8 illustrates by way of example temporal profiles of selected signals in the drive module in accordance with FIG. 6.

FIG. 8 illustrates by way of example temporal profiles of the drive signal S3 depending on the first and second control signals S1, S2. During the first operating state, in which the second control signal S2 assumes a high level, charging and discharging currents of the MOS transistor are lower than during the second operating state. In order to simplify the illustration, it is assumed in FIG. 8 that the charging and discharging currents flow in each case for a predetermined time duration after a rising or falling edge of the first control signal S1, S2. In this case, the charging and discharging currents during the first operating state are provided exclusively by the first drive unit 31, while the charging currents in the second operating state are supplied by the first and second drive units 31, 32, so that the charging and discharging currents supplied by these two units are accumulated. It is assumed in the example that the charging and discharging currents supplied by the first drive unit 31 are smaller by the factor 2 than the charging and discharging current supplied by the second drive unit.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A drive module for driving a load comprising:
   an output terminal for connecting the load;
   a first control terminal for applying a first control signal, according to which a circuit arrangement provides a supply voltage having a first or a second voltage level at the output terminal; and
   a second control terminal for applying a second control signal, wherein the slope of an edge in the event of a level change in the supply voltage being dependent on the second control signal, wherein the circuit arrangement comprises:
   a first MOS transistor having a control terminal and a load path connected between a terminal for a supply potential and the output terminal;
   a second MOS transistor having a control terminal and a load path connected between the terminal for the supply potential and the output terminal;
   a drive circuit to which the first control signal is fed and which has an output connected to the control terminal of the first transistor; and
   a switching element driven by the second control signal, said switching element being connected between the output of the drive circuit and the control terminal of the second transistor.

2. The circuit arrangement as claimed in claim 1, comprising:
   a current measuring arrangement, designed to provide a measurement current whose value is at least approximately proportional to a load current flowing to the output terminal, the proportionality factor between the load current and the measurement current being dependent on the second control signal.

3. The circuit arrangement as claimed in claim 1, comprising:
   an overcurrent detector, which compares a load current flowing to the output terminal with a limit value, the limit value being dependent on the second control signal.

4. The circuit arrangement as claimed in claim 1, comprising wherein the second control signal is a two-value signal which assumes either a first signal value for setting a first slope of the edge of the supply voltage or a second signal value for setting a second slope of the edge.

5. The circuit arrangement as claimed in claim 4, comprising wherein the proportionality factor assumes a first proportionality value in the case of the first signal value of the second control signal and a second proportionality value in the case of a second signal value of the second control signal and in which the first slope is less than the second slope and the first proportionality factor is greater than the second proportionality factor.

6. The circuit arrangement as claimed in claim 4, comprising wherein the limit value assumes a first value in the case of the first signal value of the second control signal and a second value in the case of a second signal value of the second control signal, and in which the first slope is less than the second slope and the first value is greater than the second value.

7. The circuit arrangement as claimed in claim 1, comprising wherein the first and second transistors are integrated in a common semiconductor body.

8. The circuit arrangement as claimed in claim 1, comprising a current measuring arrangement having a current measuring transistor connected to the first transistor for providing the measurement current.

9. The circuit arrangement as claimed in claim 1, comprising:
   wherein the drive circuit is adapted for providing a constant charging current for on-state driving of the first MOS transistor and, if the second switch is closed, the second MOS transistor.

10. The circuit arrangement as claimed in claim 1, comprising:

wherein the drive circuit is adapted for providing a constant discharging current for off-state driving of the first MOS transistor and, if the second switch is closed, the second MOS transistor.

11. A drive module for driving a load comprising:

an output terminal for connecting the load;

a first control terminal for applying a first control signal, according to which a circuit arrangement provides a supply voltage having a first or a second voltage level at the output terminal a second control terminal for applying a second control signal, wherein the slope of an edge in the event of a level change in the supply voltage being dependent on the second control signal;

a transistor having a control terminal and a load path connected between a terminal for a supply potential and the output terminal;

a drive circuit, to which the first control signal is fed and which has a first and a second drive stage, which each have an output terminal, the output terminal of the first driver stage being connected to the control terminal of the transistor; and a switching element driven by the second control signal, said switching element being connected between the output terminal of the second driver stage and the control terminal of the transistor.

12. The circuit arrangement as claimed in claim 11, further comprising:

a current measuring arrangement having a first and a second current measuring transistor, which are coupled to the transistor; and a further switching element driven by the second control signal and serving for switching in the second current measuring transistor.

13. The circuit arrangement as claimed in claim 11, comprising:

wherein the drive circuit is adapted for providing a constant charging current for on-state driving of the first MOS transistor and, if the second switch is closed, the second MOS transistor.

14. The circuit arrangement as claimed in claim 10, comprising:

wherein the drive circuit is adapted for providing a constant discharging current for off-state driving of the first MOS transistor and, if the second switch is closed, the second MOS transistor.

15. A drive module for driving a load comprising:

an output terminal for connecting the load;

a first control terminal for applying a first control signal, according to which a circuit arrangement provides a supply voltage having a first or a second voltage level at the output terminal; and a second control terminal for applying a second control signal, wherein the slope of an edge in the event of a level change in the supply voltage being dependent on the second control signal;

wherein the second control signal is a two-value signal which assumes either a first signal value for setting a first slope of the edge of the supply voltage or a second signal value for setting a second slope of the edge; and a transistor having a control terminal and a load path connected between a terminal for a supply potential and the output terminal;

a drive circuit, to which the first control signal is fed and which has a first and a second drive stage, which each have an output terminal, the output terminal of the first driver stage being connected to the control terminal of the transistor; and a switching element driven by the second control signal, said switching element being connected between the output terminal of the second driver stage and the control terminal of the transistor.

16. The circuit arrangement as claimed in claim 15, further comprising:

a current measuring arrangement having a first and a second current measuring transistor, which are coupled to the transistor; and a further switching element driven by the second control signal and serving for switching in the second current measuring transistor.

* * * * *